United States Patent [19]

Goldberg

[11] 3,869,641

[45] Mar. 4, 1975

[54] AC RESPONSIVE LED PILOT LIGHT CIRCUITRY

[75] Inventor: Jack Goldberg, Marshalltown, Iowa

[73] Assignee: Monsanto Company, St. Louis, Mo.

[22] Filed: Oct. 24, 1973

[21] Appl. No.: 409,116

Related U.S. Application Data

[63] Continuation of Ser. No. 265,079, June 21, 1972, abandoned.

[52] U.S. Cl. .................. 315/135, 307/311, 313/512, 315/130, 315/227 R, 315/251, 340/381

[51] Int. Cl. .............................................. H03k 3/42

[58] Field of Search ........... 315/129, 130, 133, 135, 315/136, 169 TV, 227 R, 228, 250, 251, 253, 312; 313/499, 512; 250/552, 553; 307/311, 312; 340/166 R, 166 EL, 248 R, 366 E, 366 R, 381; 357/17

[56] References Cited

UNITED STATES PATENTS

| | | | |
|---|---|---|---|
| 3,286,255 | 11/1966 | Sanchez | 340/381 |
| 3,562,609 | 2/1971 | Addamiano et al. | 357/17 |
| 3,727,056 | 4/1973 | Enemark | 357/17 X |
| 3,778,641 | 12/1973 | Persson | 307/311 X |

*Primary Examiner*—Rudolph V. Rolinec
*Assistant Examiner*—E. R. LaRoche
*Attorney, Agent, or Firm*—Peter S. Gilster; Harold R. Patton

[57] ABSTRACT

Disclosed is light-emitting electronic circuitry including a pair oppositely poled, parallel connected diodes, at least one of which is a light-emitting diode (LED); these diodes are serially connected to a capacitor between a pair of circuit AC input terminals. The capacitor provides the necessary AC voltage drop in series with these diodes when the circuitry is connected to a source of AC line voltage, and the minimum power and heat dissipated in this circuit make it especially well suited for small package pilot light applications.

4 Claims, 3 Drawing Figures

AC RESPONSIVE LED PILOT LIGHT CIRCUITRY

This is a continuation of application Ser. No. 265,079, filed June 21, 1972, now abandoned.

FIELD OF THE INVENTION

This invention relates generally to light-emitting diode panel indicator lamps and more particularly to light-emitting circuitry for use in such lamps and operable from an alternating current (AC) voltage source with a mimimum of power and heat dissipation.

BACKGROUND

The light-emitting diode (LED) per se is a well known PN junction semiconductor device which is fabricated typically from III–V intermetallic compounds, such as gallium arsenide, gallium arsenide phosphide or gallium phosphide. Light is emitted in this device by radiative recombination of holes and electrons at the PN junction thereof when a suitable forward voltage is applied to the LED. By way of example, gallium arsenide LEDs produce infrared radiation of approximately 9,000 A, gallium arsenide phosphide LEDs produce visible light of about 6,600 A, and gallium phosphide LEDs are capable of generating either green light of approximately 5,600 A or red light at approximately 7,000 A. These LEDs per se, as well as various techniques for packaging same are generally well understood in the optoelectronics art and therefore will not be described herein in further detail.

Light-emitting diode panel indicators have recently received widespread use in a variety of electronic instrumentation. These indicators normally include a single LED connected in a DC circuit with appropriate series resistance, and such circuit may be powered from a low level DC supply voltage. LED panel indicators which are so connected are suitably housed in a small package for direct plug-in connection to a variety of electronic instruments.

In many types of electronic instrumentation, the above requirement for a low level DC supply voltage for providing a low voltage forward bias on and forward current through the LED is an undesirable design constraint. Frequently, the only source of supply voltage for the instrumentation is an AC line voltage from which it is powered, and in this situation, appropriate AC/DC conversion techniques must be employed to convert the AC line voltage to an appropriate low level DC voltage for forward biasing the LED. These conversion techniques may require, among other components, step-down voltage transformers, AC/DC converters, large voltage dropping resistors, or a combination of these components in order to provide the necessary low level DC voltage for the LED, which is typically in the order of 2.0–1.5 volts DC. Because of the size and cost of these conversion components, it would be desirable to eliminate them entirely from panel indicator circuitry. Furthermore, in such prior art LED circuits where a resistor is connected in series with the LED to reduce the DC voltage thereacross, the $I^2R$ power losses developed across this series resistor and its associated heat dissipation are unacceptable for small package LED panel indicator applications.

THE INVENTION

The general purpose of this invention is to provide panel indicator light-emitting circuitry which may be directly powered from an AC line voltage without the above requirement for one or more AC/DC voltage conversion components. To attain this purpose, a pair of oppositely-poled, parallel-connected light-emitting diodes (or one LED and one other diode) are serially connected to a capacitor and the LED pair-capacitor combination is directly connectable to an AC line voltage. The capacitor voltage follows the AC line voltage, and thus provides the necessary AC voltage drop required for alternately forward biasing the diodes on the positive and negative half cycles of AC line voltage, respectively. This LED circuitry does not have resistive power losses and heat dissipation which are both generated by series voltage dropping resistors, and this feature makes the circuitry well-suited for small package panel indicator applications.

Accordingly, an object of the present invention is to provide a new and improved panel indicator light-emitting circuit operative from standard or higher levels of AC line voltage.

Another object of this invention is to provide light-emitting circuitry of the type described which is operable with a minimum of power losses and associated heat dissipation.

Another object is to provide circuitry of the type described which is suitable for a variety of AC powered panel indicator applications.

A further object of this invention is to provide light-emitting circuitry of the type described which is simple and economical in construction and reliable in operation.

DRAWING

Figure 1:
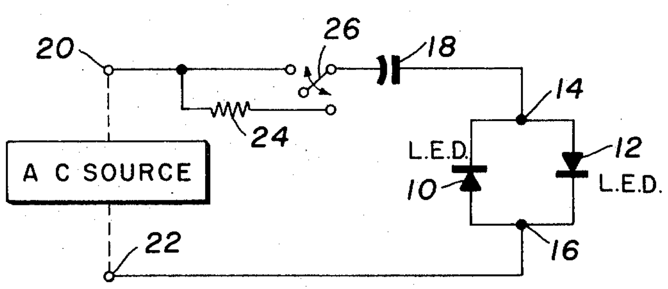
FIG. 1 is a schematic diagram of a preferred embodiment of the invention.

Referring now to FIG. 1, there is shown a pair of oppositely poled, parallel-connected light-emitting diodes 10 and 12, and these diodes are connected as shown between the out-put circuit nodes 14 and 16. These diodes are further connected in series with a voltage absorbing capacitor 18 and between a pair of circuit input terminals 20 and 22; the input terminals 20 and 22 may be directly connected to an AC voltage source, such as a standard 115 volt AC electrical outlet (not shown). As will be described, a series resistor 24 may be desired for certain circuit applications, but this resistor is not the primary AC voltage dropping component in the series circuit.

When the circuit in FIG. 1 is energized from an AC source connected to input terminals 20 and 22, with switch 26 moved from the open position shown in FIG. 1 to either closed position connecting capacitor 18 to terminal 20, current will alternately flow in opposite directions through the two diodes 10 and 12 on each half cycle of the applied voltage; and the AC voltage across the capacitor 18 will continuously follow the applied line voltage. The AC forward voltage across each forward biased diode 10 and 12 will also follow the line voltage, but the ac voltage drop across each diode is infinitely smaller than the AC voltage drop across the capacitor 18. When one LED 12 is in forward conduction and is emitting light, its voltage drop is typically in the order of two volts, which is, of course, less than the maximum reverse breakdown voltage of the other LED 10. This reverse breakdown voltage is typically in the order of three volts. When the applied voltage at the input terminals 20 and 22 reverses, the other diode 10 will conduct until the next reversal of the applied AC voltage.

If the AC line voltage applied to terminals 20 and 22 is normally 115 volts, then the peak voltage in the circuit is 115 2 or 170 volts. The parallel LED pair 10 and 12 will drop approximately 2 volts of this 170 volts, leaving the capacitor 18 to charge up to approximately 168 volts. When the switch 26 is moved from the open position shown in FIG. 1, to a closed position connecting capacitor 18 directly to terminal 20, the resistive power losses in the circuit are negligible. These losses are those associated with line resistance and the internal resistance of the components shown, all of which are negligible. However, it may be preferred to insert the resistor 24 between the capacitor 18 and one input terminal 20 by moving switch 26 from the position shown to its other closed position in order to provide an input surge current limiting impedance in the circuit when an AC voltage is initially applied thereto.

In one embodiment of the invention which has been successfully reduced to practice and connected with the switch 26 in the position shown in FIG. 1, a 10 ohm current probe (not shown) was inserted between the input terminal 20 and a 115 volts AC line voltage. The current flowing through this probe was viewed on a curve tracer, and a waveform diagram of this current is graphically illustrated in FIG. 2 of the drawing. The two light-emitting diodes 10 and 12 used were Monsanto types MV10B, which are diffused gallium arsenide phosphide diodes having a maximum reverse voltage rating of 3 volts and a maximum forward voltage rating of 2 volts. The capacitor 18 was a 0.22 microfarad non-polarized tantalum capacitor, and the peak current flowing in the 10 ohm resistor probe was measured to be 70 milliamperes (point 30 in FIG. 2).

Figure 2:
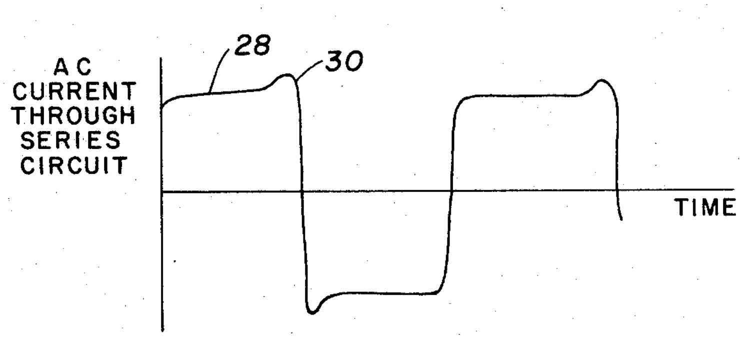
FIG. 2 is a waveform diagram of current flowing in the circuit of FIG. 1.

The current waveform 28 in FIG. 2 is non-sinusoidal and peaks at point 30 which corresponds to the peak AC voltage on each half cycle of the applied AC line voltage.

Figure 3:
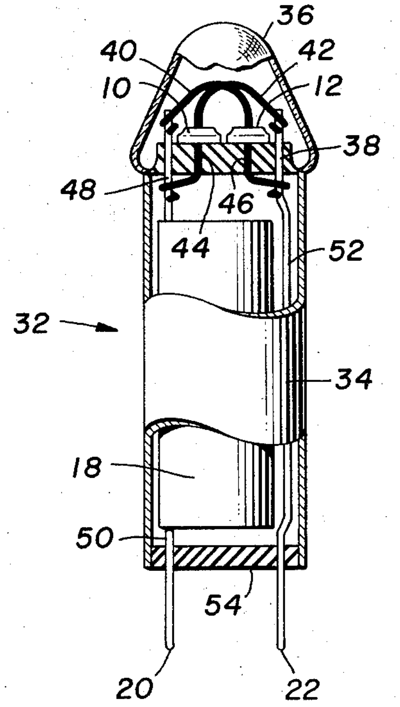
FIG. 3 illustrates a small cylindrical panel indicator package in which the light-emitting circuitry of FIG. 1 may be housed.

FIG. 3 illustrates a small cylindrical cartridge 32 which is used to house the panel indicator circuitry described above. The cartridge 32 is comprised of a hollow cylindrical housing member 34 which supports a dome type lens 36 at one end thereof through which the LED light passes. An LED supporting member in the form of a substantially cylindrical disk 38 is securely mounted as shown to the upper end of the housing 34 and inside the hollow dome lens 36. The supporting disk 38 carries the oppositely poled LEDs 10 and 12 on the upper surface thereof, with the light-emitting PN junctions of the LEDs positioned within the dome lens 36 so that the light emitted therefrom passes upwardly as shown in FIG. 3.

The two LEDs 10 and 12 may be bonded to the substrate disk 38 by any suitable die bonding means, and these diodes are connected in parallel via the crossed wires 40 and 42. These wires each pass through openings 44 and 46 in the disk 38 which may be of any suitable insulating material having a satisfactory heat sink capability.

The capacitor 18 may be a coaxial capacitor having one of its two plates (not shown) connected to the left upper conductive pin 48 and the other plate (not shown) connected to the lower left hand pin 50 which passes through the lower insulating disk 54 and whose end 20 corresponds to the input terminal 20 in FIG. 1. The right hand pin 52 runs parallel to capacitor 18 and pin 50 and extends as shown through both insulating disks 38 and 40, and these pins 48, 50 and 52 and wires 40 and 42 are insulated one from another within the cylindrical housing 34 by any suitable insulation, such as an epoxy resin or other suitable potting compound 43 having a good heat dissipation capability.

Various circuit modifications and circuit component additions may be made to the above described perferred embodiment of the invention without departing from the true scope of this invention. For example, additional resistors can be serially connected in the LED circuit shown between input terminals 20 and 22 while still utilizing my novel concept of combining parallel connected LEDs with a capacitor. Alternatively, one of the diodes 10 and 12 can be a light-emitting diode, and the other LED can be a discrete silicon diode whose forward voltage is less than the reverse breakdown voltage of the LED to which it is connected. In this modified circuit, the total light output of the circuit would be from the one LED 10 or 12 which is utilized in the circuit, but the circuit operation will remain unaltered.

Additionally, these LEDs 10 and 12 can be used as the light-emitting components for opto-isolators (sometimes referred to as coupled pairs) wherein each LED 10 or 12 is optically coupled to a detector, such as a photodiode or phototransistor. These opto-isolators can then be driven by an AC input signal applied to the circuit terminals 20 and 22.

It will be understood by those skilled in the optoelectronics art that as light-emitting diodes become more efficient with improvements in the above mentioned III–V electronic materials, the size and rating requirements for the capacitor 18 can be reduced. Such a reduction will enable a corresponding reduction in size of the cartridge 32 to be made, and such a size reduction in cartridge 32 will increase the applications in which my invention may be utilized. On the other hand, advances in capacitor technology which permit the reduction in capacitor size, while maintaining its capacitance, voltage and current ratings constant, or even increasing same, will also enable the size of the cartridge 32 to be reduced and the application of my invention increased accordingly.

I claim

1. An LED pilot light operable from a source of AC line voltage, comprising a pair of light-emitting diodes, said diodes being connected in parallel with opposite polarity, each of said diodes generating light when properly forward biased, an enclosure having a light transmissive portion, means for supporting both of said diodes in said enclosure such that light emitted by said diodes radiates from said enclosure through said light transmissive portion in a single direction, and a capacitor having one side interconnected with said pair of diodes at one junction common to said diodes, a first circuit input terminal interconnected with the other side of said capacitor, a second circuit input terminal interconnected with the other junction common to said diodes, the capacitor voltage following AC line voltage applied to said input terminals and limiting the voltage drop across said diodes as said diodes alternately conduct on respective half cycles of said AC line voltage.

2. An LED pilot light as set forth in claim 1 wherein said capacitor is mounted within said enclosure, whereby said pilot light is entirely self-contained for direct interconnection with said source of AC line voltage.

3. An LED pilot light as set forth in claim 1 wherein said enclosure is tubular and includes a lens across one end thereof, said diodes being adapted to emit radiation through said lens.

4. An LED pilot light as set forth in claim 2 wherein said enclosure and capacitor are each cylindrical and the longitudinal axes of said enclosure and capacitor extend generally in the same direction, said diodes being supported with said enclosure at one end thereof with respect to the longitudinal axis of said enclosure, and said first and second input terminals being at the other end of said enclosure.

* * * * *